(12) United States Patent
Huang et al.

(10) Patent No.: US 12,400,890 B2
(45) Date of Patent: Aug. 26, 2025

(54) APPARATUS FOR FABRICATING A SEMICONDUCTOR DEVICE AND METHOD FOR FABRICATING SEMICONDUCTOR DEVICE

(71) Applicant: TAIWAN SEMICONDUCTOR MANUFACTURING COMPANY LTD., Hsinchu (TW)

(72) Inventors: Po-Chien Huang, Hsinchu (TW);
Chung-Hung Lin, Tainan (TW);
Chih-Wei Wen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/661,750

(22) Filed: May 13, 2024

(65) Prior Publication Data
US 2024/0297057 A1    Sep. 5, 2024

Related U.S. Application Data

(62) Division of application No. 17/364,457, filed on Jun. 30, 2021, now Pat. No. 12,009,238, which is a
(Continued)

(51) Int. Cl.
*H01L 21/673*  (2006.01)
*G03F 1/62*    (2012.01)
*G03F 1/66*    (2012.01)
*G03F 7/00*    (2006.01)
*H01L 21/033*  (2006.01)
*H01T 23/00*   (2006.01)

(52) U.S. Cl.
CPC .......... *H01L 21/67359* (2013.01); *G03F 1/62* (2013.01); *G03F 1/66* (2013.01); *G03F 7/70716* (2013.01); *G03F 7/70925* (2013.01); *H01L 21/0337* (2013.01); *H01T 23/00* (2013.01)

(58) Field of Classification Search
CPC .......... H01L 21/67359; H01L 21/0337; H01L 21/027–0338; H01L 21/32; H01L 21/67703–67736; H01L 21/0273–0279; H01L 21/312–3128; H01L 21/0275; G03F 1/62; G03F 1/66; G03F 7/70716; G03F 7/70925; G03F 1/82; G03F 7/7085; G03F 7/70866; G03F 7/70908; H01T 23/00; H05F 3/04
See application file for complete search history.

(56) References Cited

U.S. PATENT DOCUMENTS

2010/0041234 A1 * 2/2010 Weigel ............... H01L 21/3105
                                                438/694
2015/0118852 A1 * 4/2015 Lee ..................... H01L 21/0273
                                                438/703
2021/0003929 A1 * 1/2021 Kim .................... G02B 5/0891

FOREIGN PATENT DOCUMENTS

JP    2001284217 A  * 10/2001
KR    20050098567 A  * 10/2005

* cited by examiner

*Primary Examiner* — Shahed Ahmed
(74) *Attorney, Agent, or Firm* — WPAT LAW; Anthony King

(57) ABSTRACT

A method for fabricating a semiconductor structure, including disposing a mask at a first position in a first chamber, generating a first plurality of ions toward the mask by an ionizer, forming a photoresist layer on a substrate, receiving the substrate in the first chamber, and exposing the photoresist layer with actinic radiation through the mask in the first chamber.

20 Claims, 12 Drawing Sheets

Related U.S. Application Data division of application No. 16/258,824, filed on Jan. 28, 2019, now Pat. No. 11,088,003.

APPARATUS FOR FABRICATING A SEMICONDUCTOR DEVICE AND METHOD FOR FABRICATING SEMICONDUCTOR DEVICE

CROSS REFERENCE TO RELATED APPLICATIONS

This application is a divisional application of U.S. patent application Ser. No. 17/364,457 filed on Jun. 30, 2021, entitled of "APPARATUS FOR FABRICATING A SEMICONDUCTOR DEVICE AND METHOD FOR FABRICATING SEMICONDUCTOR DEVICE", which is divisional application of U.S. application Ser. No. 16/258,824, filed Jan. 28, 2019, the entire disclosure of which is hereby incorporated by reference.

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

As semiconductor industry continues to evolve, advanced photolithography techniques have been widely used in integrated circuit fabrication operation. Photolithography operations may include techniques pertinent to coating a photoresist layer on a wafer and exposing the wafer to an exposing source. Subsequent to operations of coating, exposing, and developing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
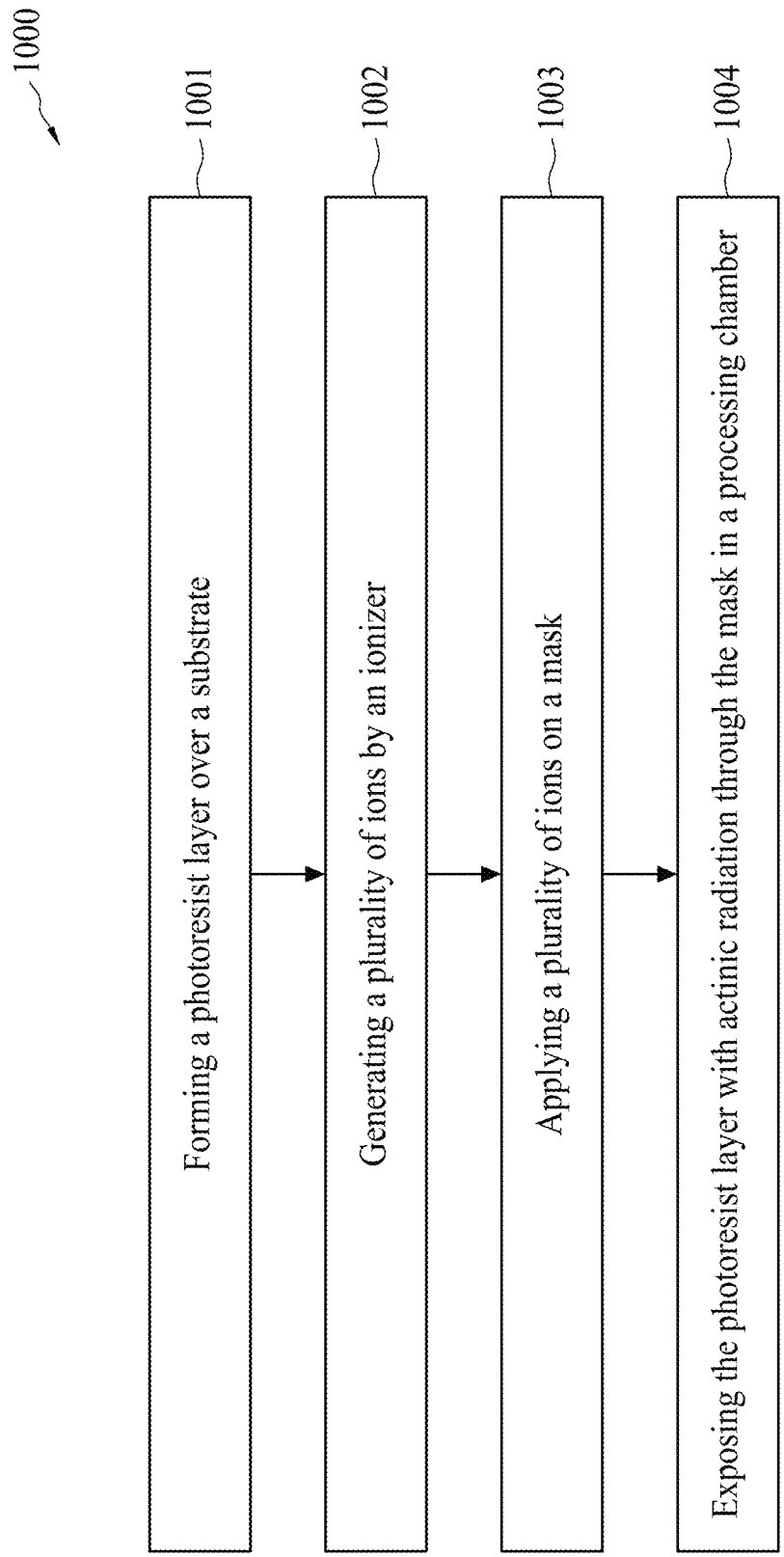
FIG. 1 shows a flow chart representing method for fabricating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Masks can be used in semiconductor fabrication operations to transfer a predetermined pattern onto a substrate. For example, after forming a photoresist layer over a substrate, the photoresist layer can be exposed to an actinic radiation through a mask, thus a photoresist pattern can be formed by subsequent development.

During the fabrication operations, electrostatic charge may accumulate on a surface of the mask by triboelectric effect stems from friction between air and mask during transferring the mask from a first position to a second position. Actinic radiation may also cause the accumulation of electrostatic charge on a surface of a mask.

The accumulation of electrostatic charge may induce electrostatic discharge (ESD), which is an event of sudden electric flow transfers a finite amount of charge between two electrically charged objects at different potentials. Electrostatic discharge stems from charge imbalances between two different objects, which may be pertinent to the difference of a property between two different materials. Specifically, electrostatic discharge is an issue for fabrication operations pertinent to the use of masks. Electrostatic discharge may be induced when an electrostatic potential difference builds up on two different regions on the mask, as the mask pattern may be damaged or distorted by induced transient discharge from accumulated electrostatic charge. The damaged or distorted mask pattern may be subsequently transferred to the photoresist layer formed on the substrate, thus deteriorating the yield rate of the semiconductor devices fabricated upon the use of the mask. A reticle of the mask may also be scrapped and defects may be induced.

Conventionally, the issue of electrostatic discharge may be alleviated by exposing the mask to air or a cleanliness-controlled environment under a period of time, wherein the electrostatic charge may be neutralized thereupon. However, along with the trend toward higher device density or higher device performance, more and more complex semiconductor structures are entailed, whereupon actinic radiation with higher energy is utilized during fabrication operations. In addition, in order to raise the efficiency of device fabrication, a mask may be used for exposing multiple substrates, wherein electrostatic charge continuously accumulates throughout the exposure operation performed on such multiple substrates. As a result, significantly greater amount of electrostatic charge may be accumulated on a surface of the mask, as electrostatic discharge may not be effectively alleviated, or it may take significantly longer period of time for electrostatic charge to be neutralized.

In order to ameliorate the efficiency of fabrication, the present disclosure provides apparatus for fabricating a semiconductor device and methods for fabricating a semiconductor device to effectively alleviate the issue of electrostatic charge accumulation and defects incurred by electrostatic discharge, while improving the efficiency of fabrication process by shorten the time for alleviating the effect of electrostatic discharge.

Referring to FIG. 1, FIG. 1 shows a flow chart representing method 1000 for fabricating a semiconductor device, in accordance with some embodiments of the present disclosure. The method 1000 for fabricating a semiconductor device includes forming a photoresist layer over a substrate (operation 1001), generating a plurality of ions by an ionizer (operation 1002), applying a plurality of ions on a mask (operation 1003), and exposing the photo resist layer with actinic radiation through the mask in a processing chamber (operation 1004).

Figure 2:
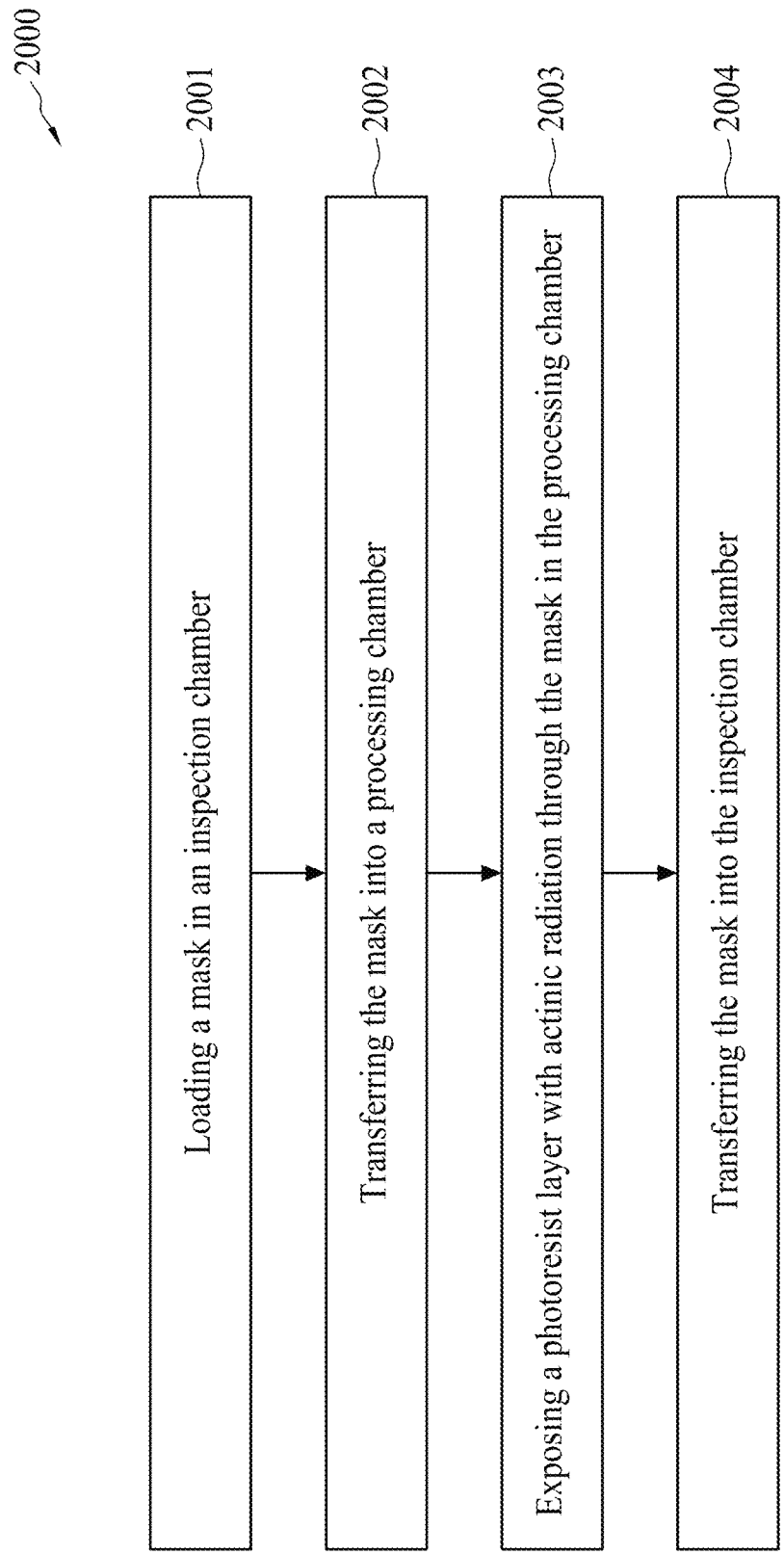
FIG. 2 shows a flow chart representing method for fabricating a semiconductor device, in accordance with some embodiments of the present disclosure.

Referring to FIG. 2, FIG. 2 shows a flow chart representing method 2000 for fabricating a semiconductor device, in accordance with some embodiments of the present disclosure. The method 2000 for fabricating a semiconductor device includes loading a mask in an inspection chamber (operation 2001), transferring the mask into a processing chamber (operation 2002), exposing a photo resist layer with actinic radiation through the mask in the processing chamber (operation 2003), and transferring the mask into the inspection chamber (operation 2004).

Figure 3A:
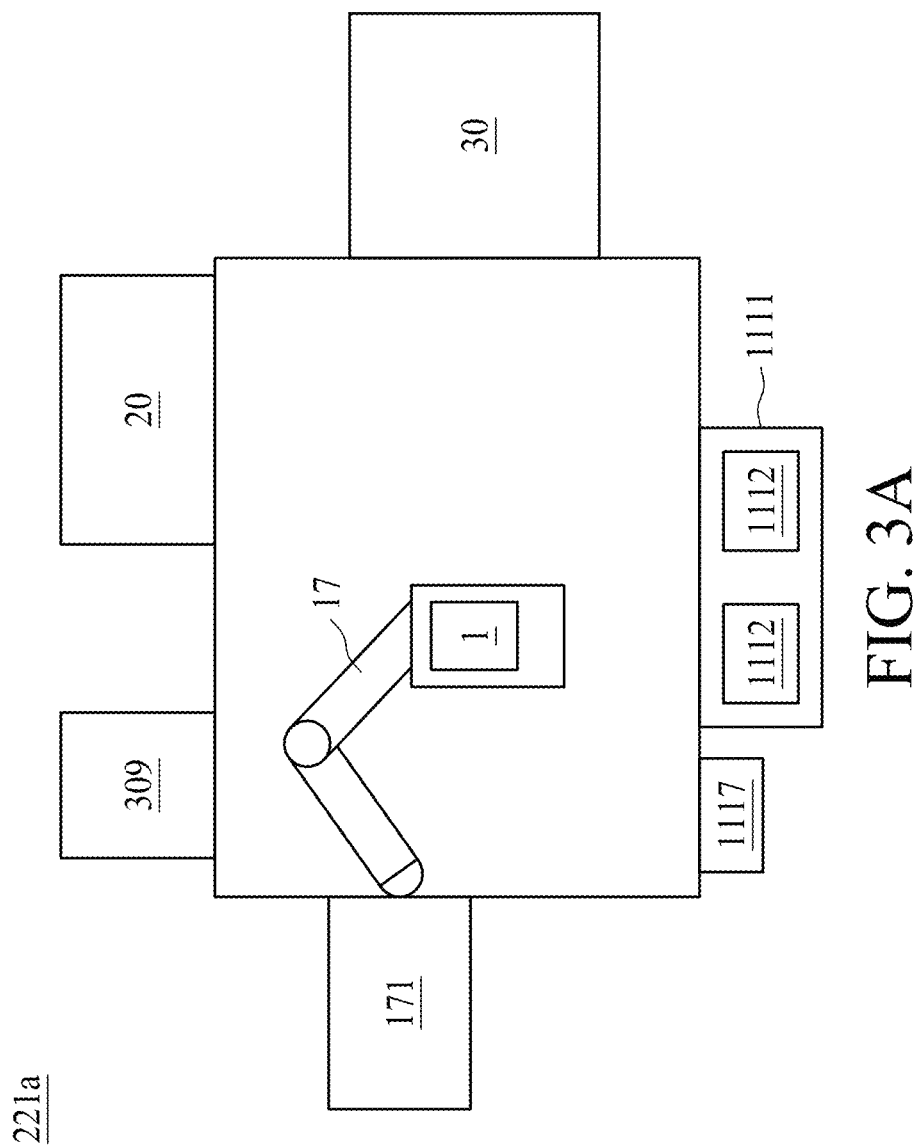
FIG. 3A is a schematic drawing illustrating an apparatus, in accordance with some embodiments of the present disclosure.

Referring to FIG. 3A, FIG. 3A is a schematic drawing illustrating an apparatus 221a, in accordance with some embodiments of the present disclosure. The apparatus 221a at least include an arm 17, an inspection chamber 20 and a processing chamber 30, wherein the inspection chamber 20 may be different from the processing chamber 30. The details of the inspection chamber 20 will be subsequently discussed in FIG. 3B, and the details of the processing chamber 30 will be subsequently discussed in FIG. 3C.

The apparatus 221a may optionally include a load port 1111, wherein the load port is configured to receive and accommodate one or more carriers 1112. Each carrier 1112 can accommodate one or more mask 1, and the carrier 1112 can be loaded in the load port 1111 or removed from the load port 1111 manually, semi-automatically, or automatically via a transportation system. The arm 17 is configured to receive the mask 1 from the carrier 1112 or load the mask 1 into the carrier 1112. In some embodiments, the apparatus 221a may optionally include a rack 309 for accommodating at least one mask 1, wherein the arm 17 can selectively receive a predetermined mask 1 from the rack 309. The apparatus 221a may include an arm controller 171 to control the arm 17, so that the arm 17 can transfer the mask 1 between the carrier 1112, the rack 309, the inspection chamber 20, and/or the processing chamber 30. The apparatus 221a may optionally include an control interface 1117 configured to allow a user to input instruction to instruct the arm 17 to transfer a mask 1 to predetermined positions on a predetermined sequence, or to instruct the arm 17 to transfer different masks 1 to predetermined positions. It should be noted that transferring of the mask 1 may also be performed by more than one arm 17.

The controller 171 and the control interface 1117 can be implemented by software such that the methods disclosed herein can be performed automatically or semi-automatically. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions can be received from a remote storage device, such as a server on a network. The present invention can also be implemented in hardware systems, microcontroller unit (MCU) modules, discrete hardware or firmware.

Figure 3B:
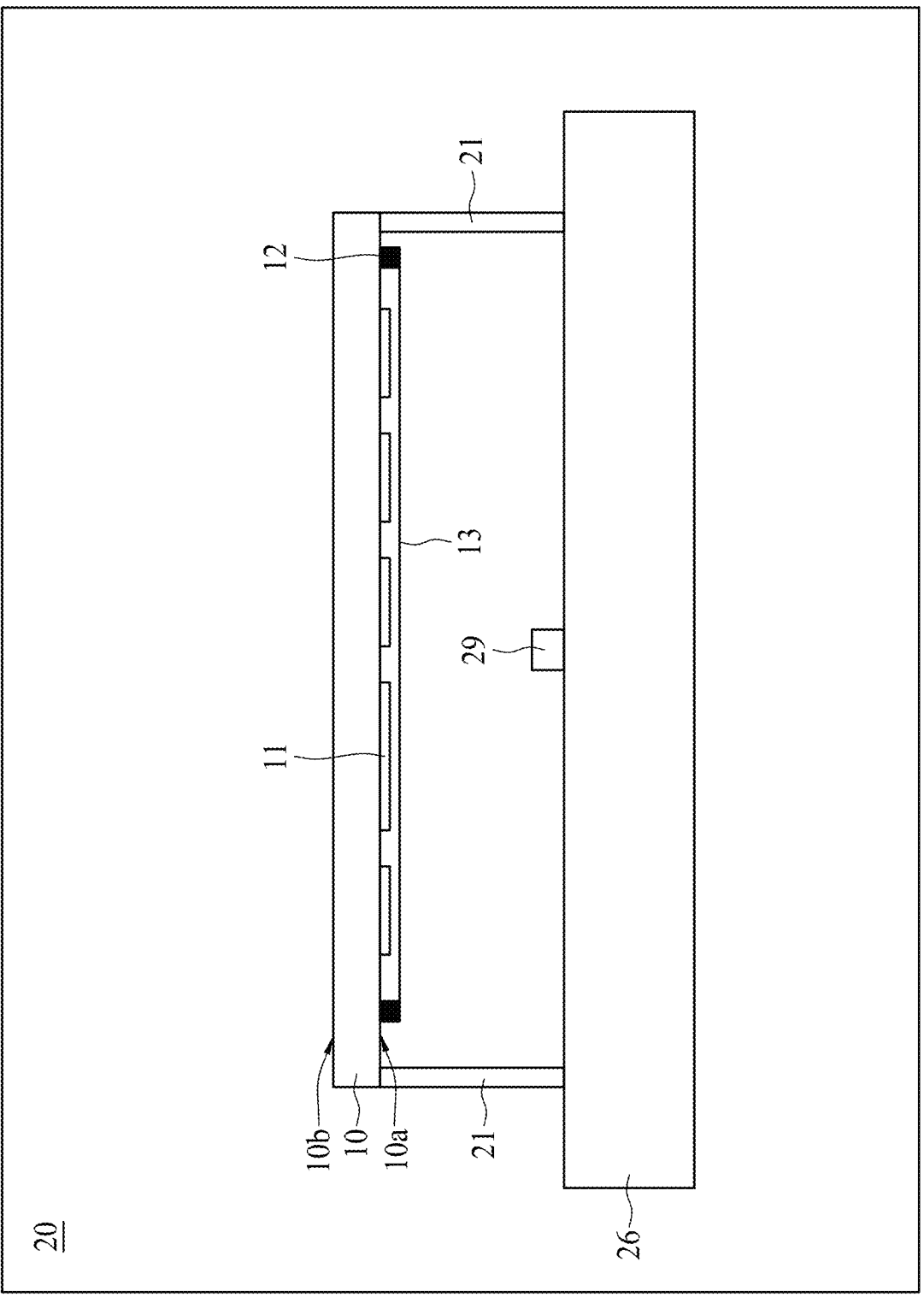
FIG. 3B is a schematic drawing illustrating an inspection chamber, in accordance with some embodiments of the present disclosure.

Referring to FIG. 2, FIG. 3A and FIG. 3B, FIG. 3B is a schematic drawing illustrating an inspection chamber 20, in accordance with some embodiments of the present disclosure. In operation 2001, the mask 1 is loaded into the inspection chamber 20 by the arm 17. The mask 1 at least includes a reticle 10 and a mask pattern 11 on a first side 10a of the reticle 10. The mask 1 may further include a pellicle frame 12 disposed over the first side 10a of the reticle 10 and a pellicle membrane 13 over the first side 10a of the reticle 10, wherein the pellicle membrane 13 is secured by the pellicle frame 12. In some embodiments, a material of the reticle 10 may include molybdenum (Mo), silicon (Si), quartz, chromium (Cr), or other suitable materials. An inspector 29 is disposed in the inspection chamber 20 to inspect the mask 1. A supporter 21 inside the inspection chamber 20 may be configured to accommodate the mask 1 over an inspection stage 26. In some embodiments, the inspector 29 may be disposed on the inspection stage 26 to inspect a distribution of defects on the pellicle membrane 13 or a predetermined portion of the mask pattern 11. In some other embodiments, the inspector 29 may be disposed over a second side 10b of the reticle 10 to inspect a predetermined portion of the mask pattern 11. If the pellicle membrane 13 or the mask pattern 11 is substantially damaged and difficult to be recovered, the mask 1 can be removed from the inspection chamber 20 by the arm 17, as the arm 17 may provide a different mask 1 to substitute the original mask 1.

In some embodiments, the inspector 29 includes a light source (not shown in FIG. 3B) configured to radiate light on the pellicle membrane 13 or on the mask pattern 11, and at least one light receiver (not shown in FIG. 3B) to receive the light reflected from the pellicle membrane 13, from the mask pattern 11, or from the reticle 10. For example, a material of the pellicle membrane 13 may be polycrystalline silicon, monocrystalline silicon, or silicon (Si)/molybdenum (Mo)/antimony (Sb) film. The light source of the inspector 29 may radiate light such as a laser beam (e.g. solid-state laser or yttrium aluminum garnet laser) or ultra-violet light, and the light is converted by a converging lens and subsequently radiated on the pellicle membrane 13. The inspector 29 may further include a first light receiver configured to receive a regularly reflected light off the pellicle membrane 13, and a second light receiver configured to receive a scattered light off defects or particles on the pellicle membrane 13, wherein the scattered light may optionally pass through lens before received by any light receivers. Information pertinent to light flux of light received by the first light receiver and the second light receiver may be transmitted to a processor and thereby calculated. By deriving the relationships pertinent to light flux of light received by the first light receiver and the second light receiver, a defect mapping on the pellicle may be generated. In some embodiments, the light source, the first light receiver, and/or the second light receiver may be configured to move in a predetermined position to improve the accuracy of inspecting the defects on the pellicle membrane 13.

In some other embodiments, the inspector 29 may include an static electricity inspector to measure electrostatic charge on a predetermined portion of the mask 1 (e.g. a surface of the pellicle membrane 13, a surface of the reticle 10, or a surface of the mask pattern 11), so the risk of inducing electrostatic discharge can be evaluated by the measurement of electrostatic charge on an aforementioned portion of the mask 1.

Figure 3C:
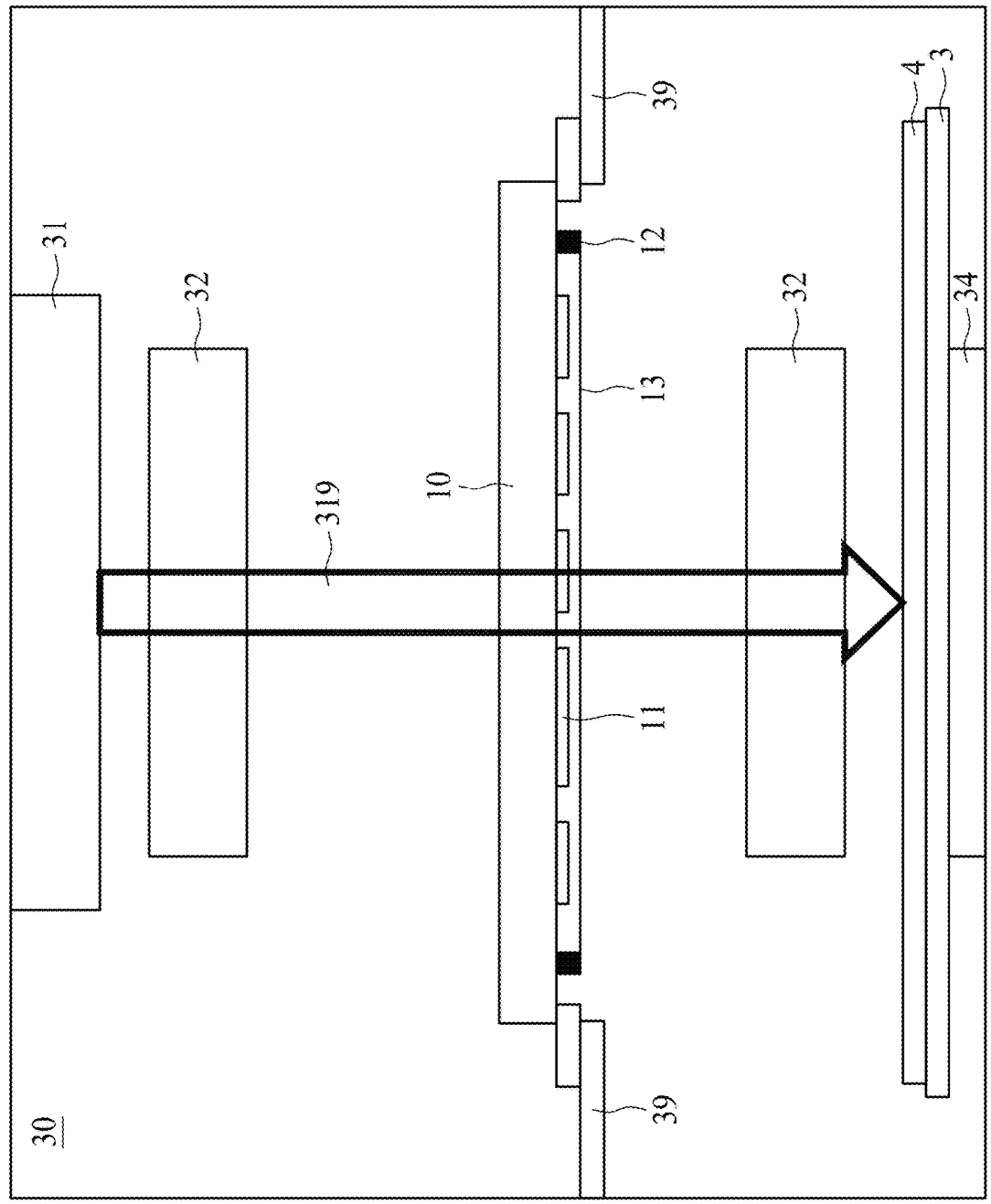
FIG. 3C is a schematic drawing illustrating a processing chamber, in accordance with some embodiments of the present disclosure.

Referring to FIG. 2, FIG. 3A and FIG. 3C, FIG. 3C is a schematic drawing illustrating a processing chamber, in accordance with some embodiments of the present disclosure. In operation 2002, the arm 17 transfers the mask 1 from the inspection chamber 20 to the processing chamber 30b. A stage 39 inside the processing chamber 30 may be config-ured to accommodate the mask 1 under an actinic radiation source 31. The actinic radiation source 31 is configured to radiate an actinic radiation 319, wherein the actinic radiation 319 may include deep ultraviolet (DUV), extreme ultraviolet (EUV), krypton fluoride (KrF) laser, argon fluoride (ArF) laser, or other suitable light utilized in photolithography fabrication. A substrate 3 with a photoresist layer 4 formed above a substrate 3 is accommodated under the mask 1 by a substrate supporter 34, so that the photoresist layer 4 can be irradiated by the actinic radiation 319 through the mask 1 in order to form a predetermined pattern. In some embodiments, one or more optical devices, such as lenses, reflection mirrors, beam splitters, beam expanders, polarizers, or wave plates, can be disposed on a path of the actinic radiation 319 from the actinic radiation source 31 to the photoresist layer 4 to alter a property of the actinic radiation 319. For example, one or more lens 32 can be optionally disposed between the mask 1 and the actinic radiation source 31, and one or more lens 32 can be optionally disposed between the mask 1 and the substrate supporter 34, so that the focus of the actinic radiation source 31 can be adjusted.

Each mask 1 may be used for exposing one or more substrates 3 with the photoresist layer 4. After predetermined cycles of exposure operations are performed, the arm 17 transfers the mask 1 to the inspection chamber 20 in order to perform aforementioned inspection on the mask 1. The inspector 29 may be configured inspect a distribution of defects on the pellicle membrane 13, a predetermined portion of the mask pattern 11, or a condition of the reticle 10, thus the condition of mask 1 subsequent to exposure operations can be assessed and further compared to a condition of the same mask 1 prior to exposure operations. In some embodiments, if the pellicle membrane 13 or the mask pattern 11 is substantially damaged and difficult to be recovered, the mask 1 can be substituted. In some embodiments, if a condition of the inspected mask 1 meets predetermined requirements, the mask 1 can be transferred to processing chamber 30 for performing exposure operations at least once more. In some other embodiments, the mask 1 is substituted by another mask 1 with different mask pattern 11 for forming a different pattern on the photoresist layer 4 over the substrate 3. In some embodiments, a substituted mask 1 can be transferred to the rack 309 or the carrier 1112, or can be accommodated inside the inspection chamber 20 for a predetermined period of time.

Figure 4:
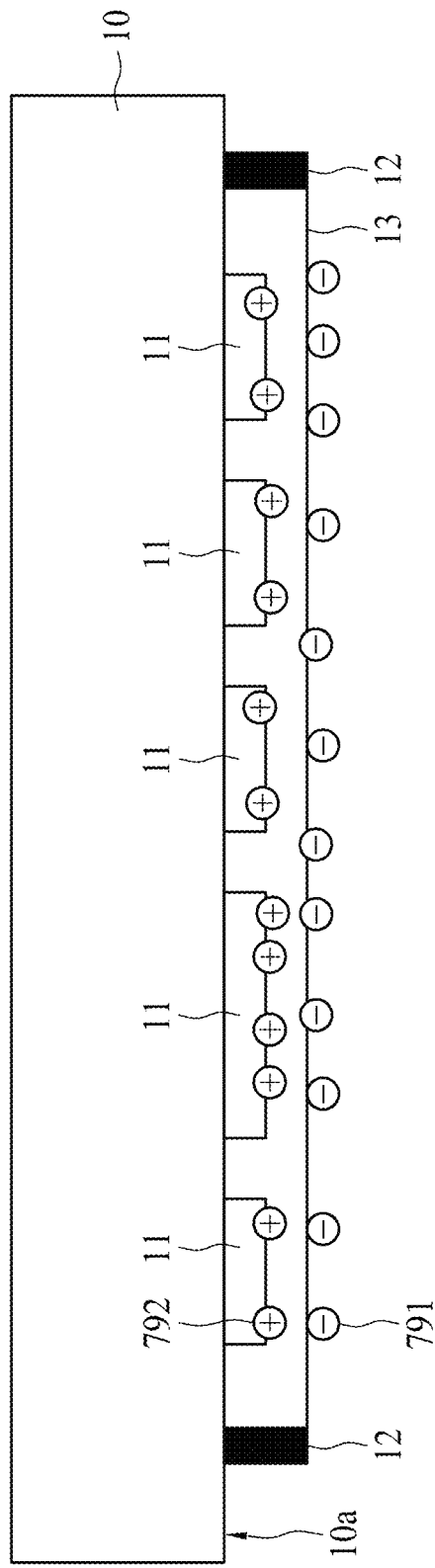
FIG. 4 is a schematic diagram showing distribution of ions on a mask, in accordance with some embodiments of the present disclosure.

Referring to FIG. 3A and FIG. 4, FIG. 4 is a schematic diagram showing distribution of ions on a mask, in accordance with some embodiments of the present disclosure. Throughout the transferring of the mask 1 between the inspection chamber 20, the processing chamber 30, the rack 309, or the carrier 1112, electrostatic charge may be accumulated on a surface of the mask 1 by triboelectric effect, which stems from friction between air and mask during transferring the mask 1 from a first position to a second position. The accumulation of electrostatic charge and the electrical imbalance may induce electrostatic discharge, as the mask pattern may be damaged or distorted thereby. The damaged or distorted mask pattern may be subsequently transferred to the photoresist layer 4 formed on the substrate 3, thus deteriorating the yield rate of the semiconductor devices fabricated upon the use of the mask 1. Specifically, a plurality of first type electric charges 791 (for example, negative electric charges) is accumulated on a surface of the pellicle membrane 13, and a plurality of second type electric charges 792 (for example, positive electric charges) opposite to the first type electric charges 791 is accumulated on a surface of the mask pattern 11 or the first side 10a of the reticle 10. If the charge imbalances between the first type electric charges 791 on the pellicle membrane 13 and the second type electric charges 792 on the surface of the mask pattern 11 or the first side 10a of the reticle 10 is above a certain threshold, electrostatic discharge may be induced and thereby damage the mask pattern 11.

In addition, the actinic radiation 319 (shown in FIG. 3C) may also cause the accumulation of electrostatic charge on a surface of a mask 1. Specifically, energy of the actinic radiation 319 may be greater or similar to a work function of the mask pattern 11 or the reticle 10, which may induce the ejection of electron, and thereby induce charge imbalances which leads to discharge and/or scrapping. For example, energy of deep ultraviolet 193 nm (DUV) is around 6.8 eV, which is greater than a work function of molybdenum (from around 4.36 eV to around 4.95 eV under certain condition) or a work function of silicon (from around 4.60 eV to around 4.85 eV under certain condition), wherein molybdenum (Mo) and silicon (Si) may be used as a material of a reticle 10 or a mask pattern 11, and the deep ultraviolet may induce the ejection of electron from a surface of the reticle 10 or a surface of the mask pattern 11. In addition, repetition of using the same mask 1 under cycles of exposure operations may further reinforce charge accumulation and/or charge imbalances.

Figure 5:
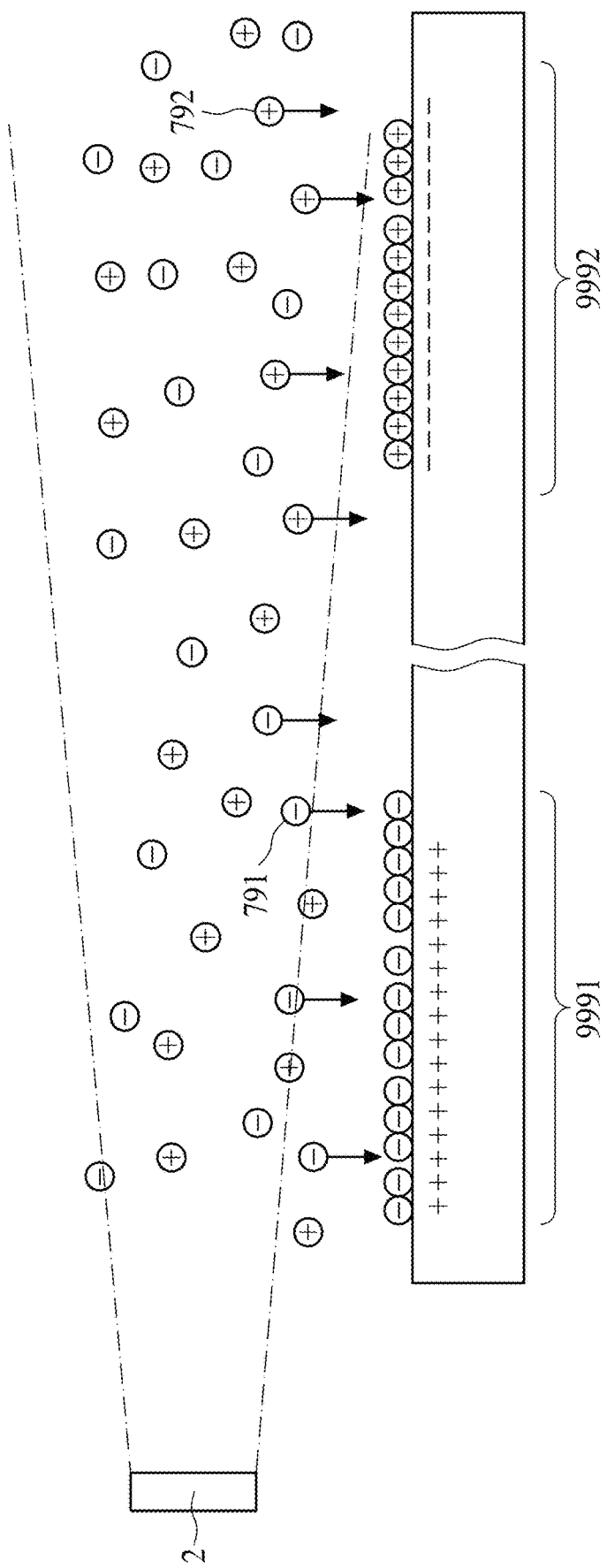
FIG. 5 is a schematic diagram showing an ionizer generating ions over two surfaces with different types of charges thereon, in accordance with some embodiments of the present disclosure.

Referring to FIG. 5, FIG. 5 is a schematic diagram showing an ionizer generating ions over two surfaces with different types of charges thereon, in accordance with some embodiments of the present disclosure. An ionizer 2 can be used to alleviate electrostatic charge accumulation and the risk of damage induced by electrostatic discharge. For example under the electrostatic effect, a first surface region 9991 has a plurality of second type electric charges 792 (for example, positive charges) induced thereon, and a second surface region 9992 has a plurality of first type electric charges 791 (for example, negative charges) induced thereon. In order to at least partially neutralize the induced second type electric charges 792 on the first surface region 9991 or the induced first type electric charges 791 on the second surface region 9992, the ionizer 2 can generate ions upon the first surface region 9991 or the second surface region 9992 for electrical neutralization. In some embodiments, the ionizer 2 is configured to ionize air to generate positive charges and negative charges. In some other embodiments, the ionizer 2 is configured to emit positive charges and negative charges. Specifically, ions generated by the ionizer may include the first type electric charges 791 and the second type electric charges 792, as the first type electric charges 791 may be attracted to the induced second type electric charges 792 on the first surface region 9991 while the second type electric charges 792 may be attracted to the induced first type electric charges 791 on the second surface region 9992, thereby at least partially neutralize the electrostatic charges induced on first surface region 9991 or the second surface region 9992. The ionizer 2 may be devices for ionizing air or ion emitter, such as alpha particle ionizer, x-ray generator, UV light generator, gamma ray generator, or the like. In some embodiments, the ionizer 2 may be an active ionizer. The details of the ionizer 2 will be subsequently discussed in FIG. 6 to FIG. 8B.

Figure 6:
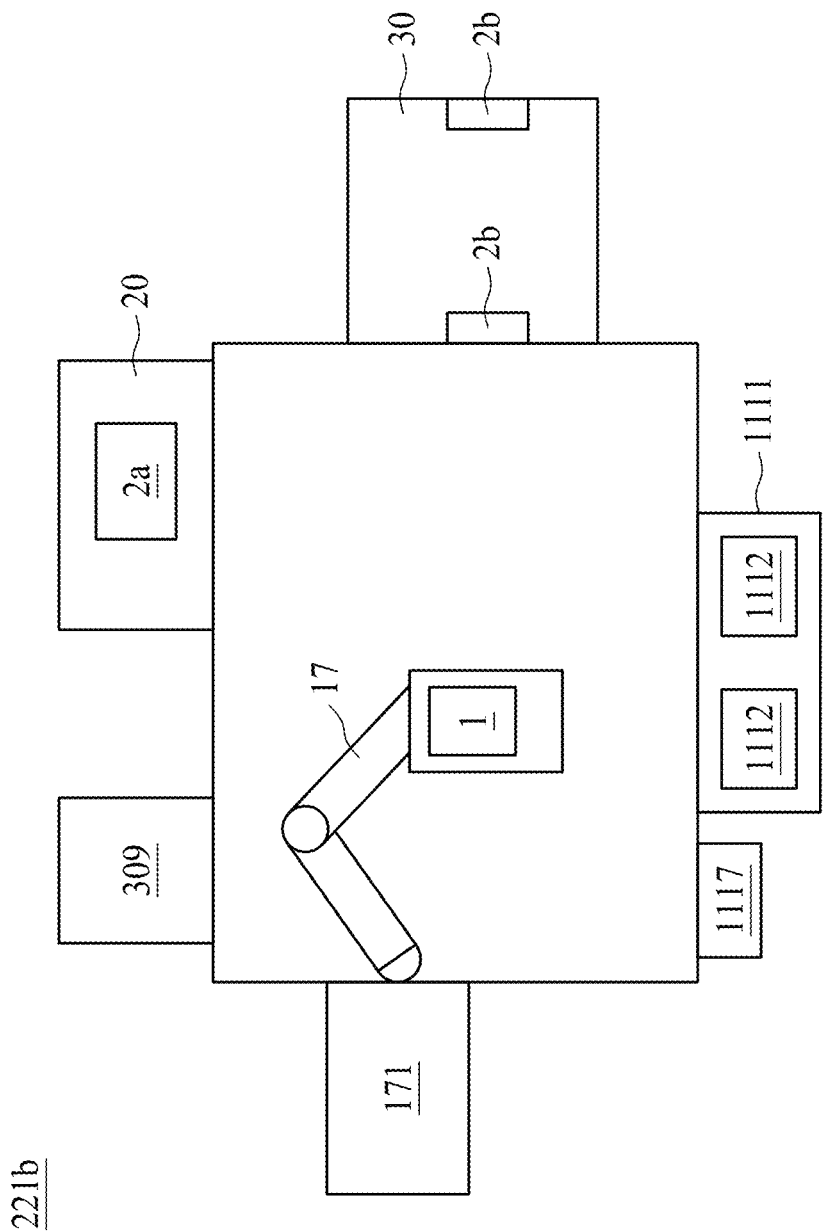
FIG. 6 is a schematic drawing illustrating an apparatus, in accordance with some embodiments of the present disclosure.

Referring to FIG. 6, FIG. 6 is a schematic drawing illustrating an apparatus 221b, in accordance with some embodiments of the present disclosure. Note that elements in FIG. 6 that are the same as or similar to their counterparts in FIG. 3A are hereinafter denoted by the same reference numerals, and redundant explanations are omitted. As previously discussed in FIG. 4, a plurality of first type electric charges 791 is accumulated on a surface of the pellicle membrane 13 and a plurality of second type electric charges 792 is accumulated on a surface of the mask pattern 11 or the first side 10a of the reticle 10. In order to further improve the alleviation of the charge imbalances between the pellicle membrane 13 and the surface of the mask pattern 11 (or the first side 10a of the reticle 10), and further alleviate the induction of damage on mask pattern 11 caused by electrostatic discharge, an ionizer 2 can be utilized for enhancing the electrical neutralization operation. The apparatus 221b may further include one or more ionizer 2 in the inspection chamber 20 (hereinafter referred to as a first ionizer 2a) and/or one or more ionizer 2 in the processing chamber 30 (hereinafter referred to as a second ionizer 2b). Thereby, an in situ electric charge neutralization operation can be performed concurrently with the inspection operation (as discussed in the FIG. 3B) and/or performed concurrently with the exposure operation (as discussed in FIG. 3C). The configuration of the first ionizer 2a in the inspection chamber 20 and the second ionizer 2b in the processing chamber 30 will be subsequently discussed in FIG. 7A to FIG. 7B and FIG. 8A to FIG. 8B respectively.

Alternatively stated, referring back to FIG. 2 to FIG. 5, subsequent to the operation 2001, while the inspector 29 is inspecting the mask 1, the ionizer 2 generates a plurality of ions and the ions are applied on the mask 1 concurrently. During the operation 2003, when the photoresist layer 4 over the substrate 3 is exposed to the actinic radiation 319, the ionizer 2 generates a plurality of ions and the ions are applied on the mask 1 concurrently. Subsequent to the operation 2004, while the inspector 29 is inspecting the mask 1 again subsequent to the exposure operation, the ionizer 2 generates a plurality of ions and the ions are applied on the mask 1 concurrently. By such configuration, the charge imbalance caused by accumulated electrostatic charge can be reduced by the neutralization of the ions, thus the risk of the mask pattern 11 being damaged by electrostatic discharge is alleviated. In addition, the efficiency of production with regard to performing inspection operations, photolithography operations, and electric charge neutralization operation are improved. It should be noted that the ions generated by the ionizer 2 may not substantially interfere with the actinic radiation 319 and the light entailed in inspection operations.

Figure 7A:
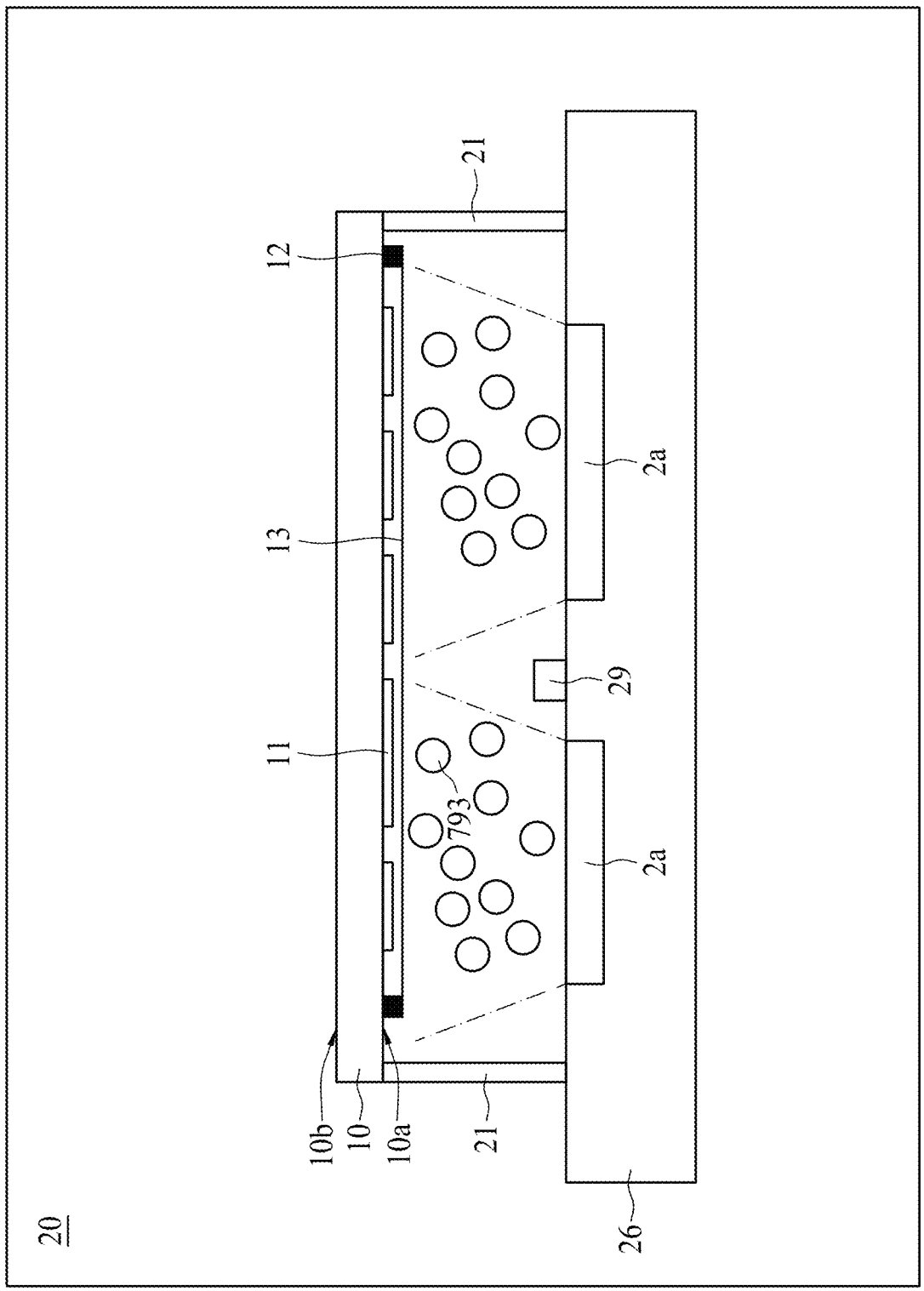
FIG. 7A is a schematic drawing illustrating an inspection chamber, in accordance with some embodiments of the present disclosure.
Figure 7B:
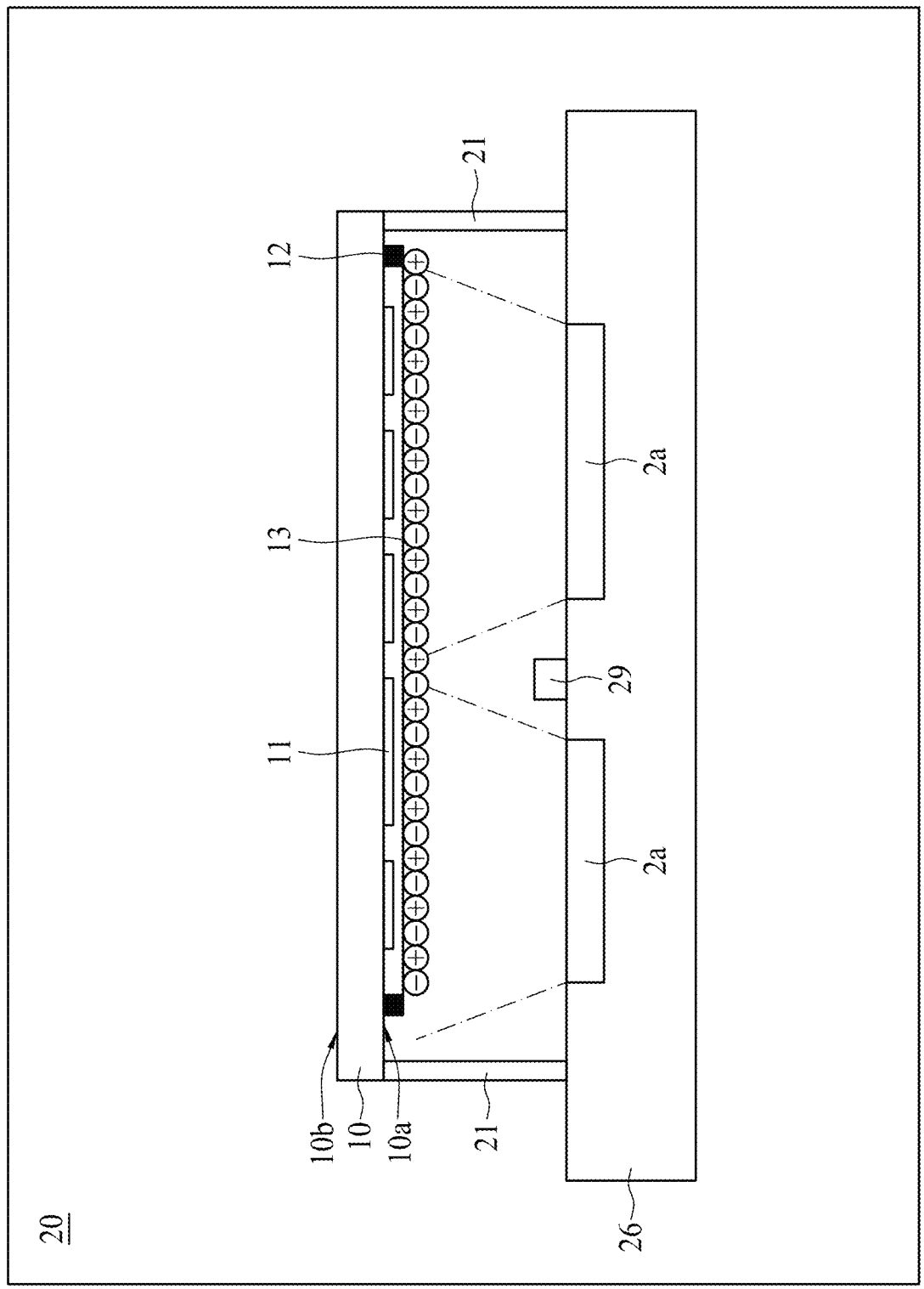
FIG. 7B is a schematic drawing illustrating an inspection chamber and a distribution of ions on a mask, in accordance with some embodiments of the present disclosure.

Referring to FIG. 7A and FIG. 7B, FIG. 7A is a schematic drawing illustrating an inspection chamber, and FIG. 7B is a schematic drawing illustrating an inspection chamber and a distribution of ions on a mask, in accordance with some embodiments of the present disclosure. The first ionizer 2a is disposed inside the inspection chamber 20 and facing the mask pattern 11 of the mask 1, wherein the supporter 21 supports the mask 1 so that the mask 1 can be disposed above the first ionizer 2a with a predetermined space. For exemplary demonstration, the first ionizer 2a herein is an alpha particle ionizer for generating alpha particles 793, which may include emitters such as americium-241 or polonium-210. Alpha particle is a particle consisting of two protons and two neutrons, and is suitable for effectively ionizing air. With collision incurred by the alpha particles 793, positive ions and negative ions are generated in the air, and such ions can be applied on the mask pattern 11 and the first side 10a of the reticle 10. It should be noted that the reticle 10 may hinder ions applied from the second side 10b, so the ions generated by the first ionizer 2a may be applied onto the first side of the reticle, therefore the ions generated by the first ionizer 2a may not be substantially obstructed by the pellicle membrane 13. By the configuration of the first ionizer 2a, the electrostatic potential difference between the pellicle membrane 13 and the first side 10a of the reticle 10 (or a surface of the mask pattern 11) is reduced, thus alleviating the risk of inducing electrostatic discharge.

Figure 8A:
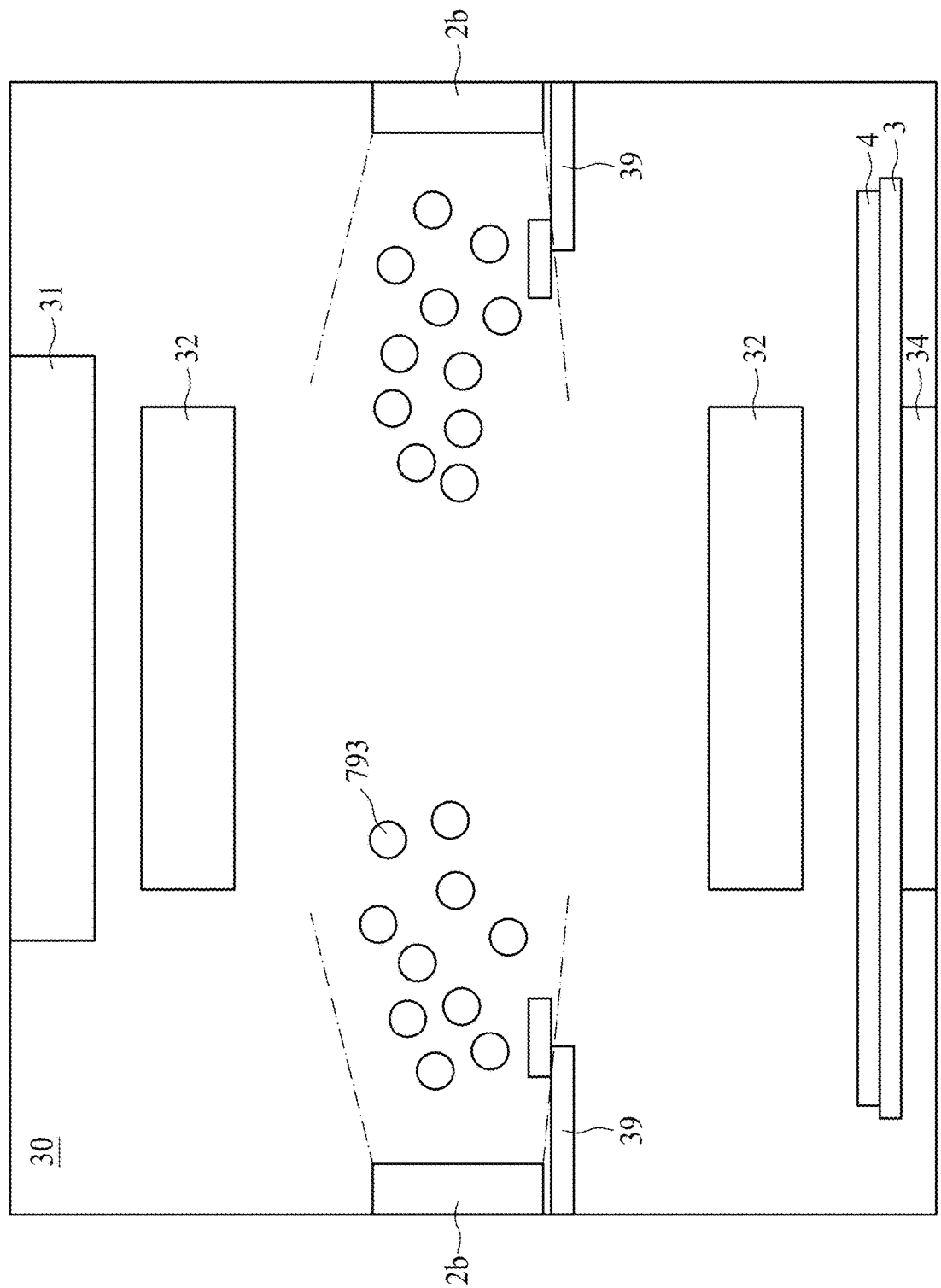
FIG. 8A is a schematic drawing illustrating a processing chamber, in accordance with some embodiments of the present disclosure.
Figure 8B:
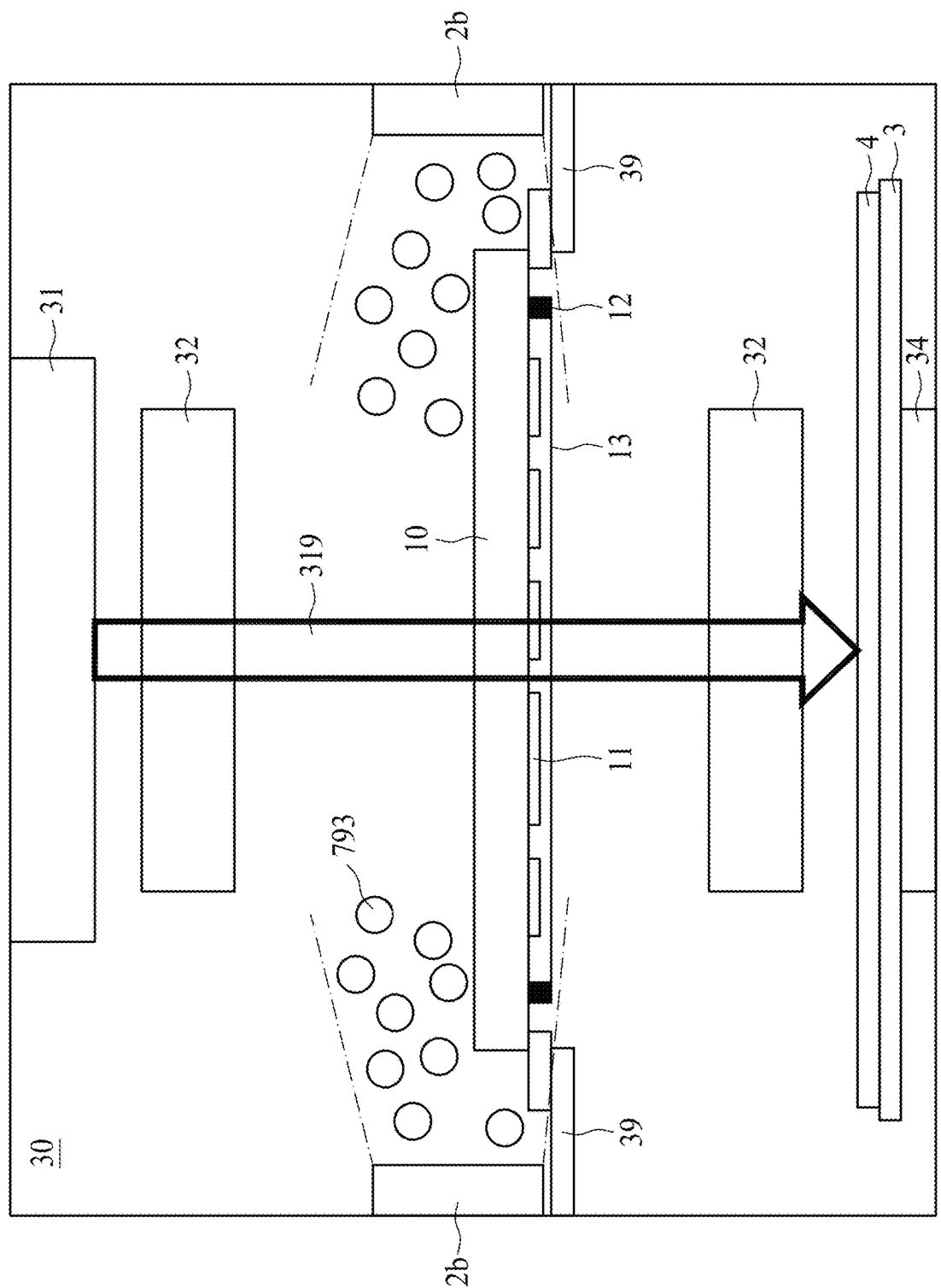
FIG. 8B is a schematic drawing illustrating a processing chamber, in accordance with some embodiments of the present disclosure.

Referring to FIG. 8A and FIG. 8B, FIG. 8A is a schematic drawing illustrating a processing chamber, and FIG. 8B is a schematic drawing illustrating a processing chamber, in accordance with some embodiments of the present disclosure. The stage 39 is configured to support the mask 1, so that the mask 1 can be disposed at least partially lateral to the second ionizer 2b. Similar to the first ionizer 2a, the second ionizer 2b can be an alpha particle ionizer for generating alpha particles 793, and the second ionizer 2b can be disposed lateral to the stage 39, lower than the stage 39, or higher than the stage 39, wherein at least a partial of the ions generated by the second ionizer 2b can be applied toward the first side 10a of the reticle 10 or to a position around the pellicle membrane 13. By the configuration of the second ionizer 2b, the generated positive ions and the negative ions may be attracted toward the mask 1 and at least partially neutralize the opposite charge, whereby the electrostatic potential difference between the pellicle membrane 13 and the first side 10a of the reticle 10 (or a surface of the mask pattern 11) is reduced, thus alleviating the risk of inducing electrostatic discharge.

The ionizer 2, the first ionizer 2a, and the second ionizer 2b discussed in the present disclosure is not limited to the alpha particle ionizer, as x-ray generator, UV light generator, gamma ray generator, ions emitter, or other suitable ionizer which does not substantially damage the mask 1 may be utilized. In addition, some of the ionizers are active ionizer which may not require electricity, such as the alpha particle ionizer. Therefore, subsequent to a predetermined usage time (which can be derived from the half-life of the decaying emitter), the active ionizers may be replaced by a similar one.

The present disclosure provides an apparatus for fabricating a semiconductor device and methods for fabricating a semiconductor device. By incorporating a first ionizer 2a in the inspection chamber 20 and a second ionizer 2b in the processing chamber 30, the ionizer 2a and the second ionizer 2b may ionize air in each chamber and generate ions toward the first side 10a of the mask 10. As a result, at least a partial of electrostatic charge accumulated on a surface of the mask may be neutralized, as electrostatic discharge may be effectively alleviated. In addition, such configuration can improve the efficiency of the efficiency of production with regard to performing inspection operations, photolithography operations, and electric charge neutralization operation; while the space occupied by the apparatus may not be significantly increased.

Some embodiments of the present disclosure provide an apparatus for fabricating a semiconductor device, including a first chamber for accommodating a mask, and a first ionizer in the first chamber, wherein the first ionizer is adjacent to the mask.

Some embodiments of the present disclosure provide an apparatus for fabricating a semiconductor device, including a first chamber for accommodating a mask, a first ionizer in the first chamber, wherein the mask is above the first ionizer, and an inspector in the first chamber, wherein the inspector is configured to inspect the mask.

Some embodiments of the present disclosure provide a method for fabricating a semiconductor device, including forming a photoresist layer over a substrate, generating a plurality of ions by an ionizer, applying a plurality of ions on a mask, and exposing the photoresist layer with actinic radiation through the mask in a first chamber.

Some embodiments of the present disclosure provide a method for fabricating a semiconductor structure, including disposing a mask at a first position in a first chamber, generating a first plurality of ions toward the mask by an ionizer, forming a photoresist layer on a substrate, receiving the substrate in the first chamber, and exposing the photoresist layer with actinic radiation through the mask in the first chamber.

Some embodiments of the present disclosure provide a method for fabricating a semiconductor structure. The method includes following operations. A mask and a substrate are received in a processing chamber. A photoresist layer is formed on the substrate. A plurality of ions are applied on a lateral side of the mask. The photoresist layer is exposed with actinic radiation through the mask in the processing chamber.

Some embodiments of the present disclosure provide a method for fabricating a semiconductor structure, including generating a plurality of ions in a processing chamber, disposing a mask in the processing chamber, applying the plurality of ions toward a lateral side of the mask, receiving a substrate comprising a photoresist layer in the processing chamber, and exposing the photoresist layer with actinic radiation through the mask in the processing chamber.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor structure, comprising:
   disposing a mask at a first position in a first chamber;
   generating a first plurality of ions toward the mask by an ionizer;
   forming a photoresist layer on a substrate;
   receiving the substrate in the first chamber; and
   exposing the photoresist layer with actinic radiation through the mask in the first chamber,
   wherein generating the first plurality of ions toward the mask and exposing the photoresist layer with actinic radiation are performed concurrently.

2. The method of claim 1, wherein the first position is between the substrate and an actinic radiation source configured to irradiate actinic radiation.

3. The method of claim 1, wherein the ionizer comprises americium-241 or polonium-210.

4. The method of claim 1, wherein the first plurality of ions is emitted toward a lateral side of the mask.

5. The method of claim 1, further comprising a stage configured to receive and support the mask, wherein the stage is disposed adjacent to the ionizer.

6. The method of claim 5, wherein the mask is disposed at least partially lateral to the ionizer.

7. The method of claim 5, further comprising one or more lens between the actinic radiation source and the mask, and the ionizer emits the first plurality of ions toward a space between the stage and an actinic radiation source configured to irradiate actinic radiation.

8. A method for fabricating a semiconductor structure, comprising:
    receiving a mask and a substrate in a processing chamber, wherein a photoresist layer is formed on the substrate;
    applying a plurality of ions on a lateral side of the mask; and
    exposing the photoresist layer with actinic radiation through the mask in the processing chamber,
    wherein applying the plurality of ions on the lateral side of the mask and exposing the photoresist layer with actinic radiation are performed concurrently.

9. The method of claim 8, wherein the actinic radiation causes an accumulation of electrostatic charges on a surface of the mask.

10. The method of claim 9, wherein the plurality of ions are applied to the surface of the mask to neutralize the electrostatic charges.

11. The method of claim 8, wherein the applying of the plurality of ions on mask further comprises:
    generating the plurality of ions by an ionizer; and
    emitting the plurality of ions toward a lateral side of the mask.

12. The method of claim 11, wherein the ionizer is disposed between the substrate and an actinic radiation source configured to irradiate the actinic radiation.

13. The method of claim 11, wherein the ionizer comprises americium-241 or polonium-210.

14. The method of claim 8, further comprising: a stage configured to accommodate the mask under an actinic radiation source configured to irradiate actinic radiation, wherein an ionizer for applying the plurality of ions is disposed adjacent to the lateral side of the mask.

15. The method of claim 8, wherein the mask is disposed between the substrate and an actinic radiation source configured to irradiate the actinic radiation.

16. A method for fabricating a semiconductor structure, comprising:
    generating a plurality of ions in a processing chamber;
    disposing a mask in the processing chamber;
    applying the plurality of ions toward a lateral side of the mask;
    receiving a substrate comprising a photoresist layer in the processing chamber; and
    exposing the photoresist layer with actinic radiation through the mask in the processing chamber,
    wherein applying the plurality of ions toward the lateral side of the mask and exposing the photoresist layer with actinic radiation are performed concurrently.

17. The method of claim 16, wherein the plurality of ions comprise alpha particles.

18. The method of claim 16, wherein the actinic radiation causes an accumulation of electrostatic charges on a surface of the mask.

19. The method of claim 18, wherein the plurality of ions are applied to the surface of the mask to neutralize the electrostatic charges.

20. The method of claim 16, wherein the generating of the plurality of ions is performed prior to the disposing of the mask in the processing chamber.

* * * * *